(12) United States Patent
Kurtz et al.

(10) Patent No.: US 10,010,958 B2
(45) Date of Patent: Jul. 3, 2018

(54) SOLDERING MODULE

(71) Applicant: ERSA GmbH, Wertheim (DE)

(72) Inventors: Rainer Kurtz, Wertheim (DE);
Michael Schaefer, Kuelsheim (DE)

(73) Assignee: ERSA GmbH, Wertheim (DE)

( * ) Notice: Subject to any disclaimer, the term of this patent is extended or adjusted under 35 U.S.C. 154(b) by 0 days.

(21) Appl. No.: 15/281,687

(22) Filed: Sep. 30, 2016

(65) Prior Publication Data

US 2017/0189981 A1    Jul. 6, 2017

(30) Foreign Application Priority Data

Oct. 9, 2015 (DE) .................. 10 2015 219 611

(51) Int. Cl.
| | |
|---|---|
| *B23K 31/02* | (2006.01) |
| *B23K 3/06* | (2006.01) |
| *B23K 3/08* | (2006.01) |
| *H05K 13/04* | (2006.01) |
| *B23K 1/08* | (2006.01) |

(Continued)

(52) U.S. Cl.
CPC ............ *B23K 3/0638* (2013.01); *B23K 1/085* (2013.01); *B23K 3/0653* (2013.01); *B23K 3/082* (2013.01); *H05K 3/34* (2013.01); *H05K 13/0465* (2013.01); *B23K 2201/42* (2013.01)

(58) Field of Classification Search
CPC .. B23K 3/0638; B23K 3/082; B23K 2201/42; B23K 1/08–1/085; B23K 3/0646–3/0692; H05K 13/0465; H05K 3/34
USPC ....... 228/256–262, 33, 36–37, 40, 56.1–56.2
See application file for complete search history.

(56) References Cited

U.S. PATENT DOCUMENTS

| | | | | |
|---|---|---|---|---|
| 4,799,616 A | * | 1/1989 | Simpson | .................. B23K 1/08 228/125 |
| 5,590,455 A | * | 1/1997 | Kato | .................... B23K 3/0607 29/33 M |

(Continued)

FOREIGN PATENT DOCUMENTS

| | | |
|---|---|---|
| DE | 102004062866 A1 | 6/2006 |
| DE | 102004063488 A1 | 12/2006 |

(Continued)

OTHER PUBLICATIONS

English Language Abstract of WO2014086954.

(Continued)

*Primary Examiner* — Kiley Stoner
(74) *Attorney, Agent, or Firm* — Ware, Fressola, Maguire & Barber LLP

(57) ABSTRACT

A soldering module for a soldering system for selective wave soldering, having at least one first and one second solder pot, wherein the solder pots are displaceable along an x-axis by means of an x-axis drive, along a y-axis by means of a y-axis drive, and along a z-axis by means of a z-axis drive, wherein the axes are all arranged orthogonally in relation to each other; wherein two y-axis drives and two moving devices are provided on which the solder pots are displaceable along the y-axis by means of the y-axis drives; wherein a first moving device is associated with the first solder pot, and wherein a second moving device which is different from the first moving device is associated with the second solder pot.

13 Claims, 4 Drawing Sheets

(51) Int. Cl.
*H05K 3/34* (2006.01)
*B23K 101/42* (2006.01)

(56) References Cited

U.S. PATENT DOCUMENTS

| | | | | |
|---|---|---|---|---|
| 6,357,649 | B1* | 3/2002 | Okatsu | B23K 1/06 228/1.1 |
| 6,705,506 | B1* | 3/2004 | Sund | B23K 1/08 228/42 |
| 7,311,241 | B2* | 12/2007 | Taga | H05K 3/3468 228/180.1 |
| 8,328,069 | B2* | 12/2012 | Isler | B23K 1/085 228/219 |
| 9,550,246 | B2* | 1/2017 | Colijn | B23K 3/0669 |
| 2009/0179067 | A1* | 7/2009 | Serrano | B23K 3/087 228/180.1 |
| 2010/0001046 | A1* | 1/2010 | Alvarez Serrano | B23K 1/08 228/208 |
| 2011/0031297 | A1* | 2/2011 | Nakaya | B23K 3/0653 228/102 |
| 2012/0062727 | A1* | 3/2012 | Kaida | H05K 13/0413 348/87 |
| 2013/0199386 | A1* | 8/2013 | Lynch | B41F 15/0881 101/123 |
| 2014/0034708 | A1* | 2/2014 | Cheung | H01L 31/186 228/103 |
| 2014/0117067 | A1* | 5/2014 | Sato | B23K 3/0638 228/33 |
| 2015/0090770 | A1* | 4/2015 | Mantani | B23K 3/08 228/102 |
| 2015/0144683 | A1* | 5/2015 | Ootake | B23K 3/0638 228/248.1 |
| 2015/0216058 | A1* | 7/2015 | Mantani | B41F 15/12 427/282 |
| 2015/0298233 | A1* | 10/2015 | Dreikorn | B23K 1/0016 228/102 |
| 2017/0209949 | A1* | 7/2017 | Colijn | B23K 1/085 |

FOREIGN PATENT DOCUMENTS

| | | |
|---|---|---|
| DE | 102005028683 A1 | 12/2006 |
| DE | 102006021946 A1 | 11/2007 |
| DE | 102012101979 A1 | 9/2013 |
| EP | 0058766 A2 * | 9/1982 ........... B23K 3/0653 |
| EP | 0311393 A2 | 4/1989 |
| JP | 2000037846 A * | 2/2000 |
| WO | 2014086954 | 6/2014 |

OTHER PUBLICATIONS

English Language Abstract of DE 102006021946A1.
DE102004062866A1 English language Abstract (1 page).
DE102004063488A1 English Language Abstract (1 page).
DE102005028683A1 English Language Abstract (1 page).
DE102012101979A1 English Language Abstract (1 page).
WO 2014086954 English Language Abstract.

* cited by examiner

SOLDERING MODULE

BACKGROUND OF THE INVENTION

1. Field of the Invention

The invention relates to a soldering module for a soldering system for selective wave soldering, having at least one first and one second solder pot, wherein the solder pots are displaceable along an x-axis by means of an x-axis drive, along a y-axis by means of a y-axis drive, and along a z-axis by means of a z-axis drive, wherein the axes are all arranged orthogonally in relation to each other.

2. Description of Related Art

In the field of bonding electronic components which, for example, are attached using through hole technology (THT)—from a top side of a printed circuit board through a hole in the printed circuit board—it is known to bond the components from a bottom side of the printed circuit board.

What is known as selective wave soldering has become known for bonding individual pins or series of pins by soldering, in which an assembly or a pin to be bonded is positioned precisely over a standing wave of a liquid solder. In what is known as fluxing, it is furthermore known to first spray a flux with a spray nozzle onto the pins/pin series to be soldered to improve wetting by the solder, wherein individual pins are then soldered by what is known as point soldering, or pin series are soldered by traveling along a path from the first to the last pin of the pin series.

For example, it is known to position a printed circuit board—using a positioning device—precisely over a standing wave of a solder pot arranged statically in a soldering system, and then if applicable to lower the printed circuit board for point soldering until the standing wave of the solder contacts the pin. In this case, the entire printed circuit board is accordingly moved relative to the standing wave generated in the static solder pot. However, such a procedure has proved to be comparatively time-consuming.

Soldering modules for a soldering system for selective wave soldering, having at least one first and one second solder pot (14, 18), wherein the solder pots are displaceable along an x-axis by means of an x-axis drive (34), along a y-axis by means of a y-axis drive (26, 28), and along a z-axis by means of a z-axis drive (38, 40), wherein the axes are all arranged orthogonally in relation to each other are furthermore known from the prior art, wherein the solder pot can be moved in the direction of the x-axis, the y-axis and Z-axis relative to a printed circuit board to be processed that is statically arranged during processing. However according to the prior art it is only possible to move both solder pots in sync with each other since both solder pots are moved in the direction of the y-axis by a common y-axis drive, and hence also only a common movement of the solder pots in the direction of the x-axis is feasible. From the prior art, it is therefore only known to move to the solder pots independently of each other in the direction of a z-axis, i.e. toward the printed circuit board to be processed or away from the printed circuit board to be processed. The two solder pots are therefore always moved in sync along the x-axis and y-axis, i.e. in a plane parallel to a printed circuit board to be processed.

When processing printed circuit board panels, i.e. complete printed circuit boards that consist of individual printed circuit boards that have (for example) a plurality of identical circuit functions with the same design but that have not yet been individualized, it has been shown that a processing of printed circuit board panels using pots moved in sync is undesirable, in particular when the individual printed circuit boards are oriented differently.

SUMMARY OF THE INVENTION

The object of the present invention is therefore to provide a soldering module for a soldering system for selective wave soldering, by means of which it is possible to process printed circuit boards in a simple and flexible manner.

This object is achieved by a soldering module having the features of claim 1. Such a soldering module is distinguished in that two y-axis drives and two moving devices are provided on which the solder pots are displaceable along the y-axis by means of the y-axis drives, wherein a first moving device is associated with the first solder pot, and wherein a second moving device which is different from the first moving device is associated with the second solder pot.

Advantageously, a respective solder pot respectively comprises a solder nozzle and a container for liquid solder, as well as a solder pump for conveying the liquid solder to the solder nozzle. It is also conceivable for a solder pot to comprise a plurality of solder nozzles with nozzle diameters that are different from one another. Furthermore, it may also be provided that a solder pot also comprises a spray nozzle for applying flux in what is known as fluxing. It is conceivable to use a different soldering material in the first solder pot and second solder pot.

By providing two y-axis drives and two moving devices, greater variability of the soldering module can be achieved, wherein a processing of printed circuit board panels is now enabled when the printed circuit boards are arranged in the direction of the y-axis.

To independently displace the solder pot along the y-axis on the respective moving devices, it has proven to be particularly advantageous when the first y-axis drive can be operated independently of the second y-axis drive.

One advantageous development of the soldering module is distinguished in that a guide is provided on which the first and second moving device can be moved along the x-axis. It is thereby particularly preferable when the x-axis drive is designed such that the first and second moving device can be moved independently of each other along the x-axis.

Another advantageous development of the soldering module is characterized in that the first moving device is associated with a first guide and can be moved along the x-axis on the first guide, wherein the second moving device is associated with a second guide and can be moved along the x-axis on the second guide.

It has proven to be particularly advantageous when two x-axis drives for moving the moving devices on the first and second guide are provided that can be operated independently of each other. Accordingly, the first moving device on the first guide can be moved along the x-axis, wherein the second moving device can be moved on the second guide along the x-axis independently of the first moving device.

Advantageously, the axial drives are designed as linear drives and/or as rack and pinion drives and/or as spindle drives and/or as toothed belt drives. It is thereby also conceivable to provide different types of drives for different axial directions. It has, however, proven to be advantageous when the axial drives are designed as linear drives, in particular as linear motors.

In another advantageous embodiment of the soldering module, it is provided that the soldering module has a control device.

It is thereby particularly advantageous when the control device for actuating the axial drives is designed such that a collision of the solder pots is avoided.

In one economical development of the soldering module, it is provided that the control device comprises a CNC control which is designed such that only the first solder pot is moved, and the second solder pot remains in a park position. Advantageously, the CNC control then only controls the axial drives that are associated with the first solder pot, or only the axial drives that are associated with the second solder pot. Those axial drives are associated with a solder pot which cause a displacement of the respective solder pot when activated or operated.

Another economical development of the soldering module provides that the control device comprises a CNC control which is designed such that the first solder pot and the second solder pot are displaced in sync. Advantageously, the CNC control controls the axial drives associated with the first solder pot, and the axial drives that are associated with the second solder pot are synchronous.

In one particularly variable embodiment of the soldering module, it is provided that the control device comprises a first CNC control that controls the axial drives that are associated with the first solder pot, and that the control device comprises a second CNC control that controls the axial drives that are associated with the second solder pot. Advantageously, the first CNC control then also controls a first z-axis drive for displacing the first solder pot along the z-axis, wherein the second CNC control controls a second z-axis drive for displacing the second solder pot along the z-axis.

When two separate CNC controls are provided, it is conceivable for both solder pots to be moved within the same work area. In this case, it is particularly advantageous when the control device for actuating the axial drives is designed such that a collision of the solder pots is avoided. It is, however, also possible for both solder pots to be moved in separate work areas that are different from each other. For example, in the context of creating a CNC program, it can be ensured that the work areas of the two solder pots do not overlap.

To increase the variability of the soldering module, it has proven to be advantageous when the first solder pot has a first tool, in particular a first solder nozzle, and when the second solder pot has a second tool, in particular a second solder nozzle, wherein the first tool is different from the second tool. It is also conceivable for different spray nozzles to be provided for applying flux, i.e. different fluxer nozzles, so to speak. It is furthermore possible to use a first solder in the first solder pot, and to use a second solder which is different from the first solder in the second solder pot.

The aforementioned object is also achieved with a soldering system for selective wave soldering having the soldering module as set forth herein, as well as a method for operating a soldering module, where at least one first solder pot (14) and the at least one second solder pot (18) move independently of each other in the x-axis, y-axis, and z-axis.

Additional details and advantageous embodiments of the invention are to be taken from the description below, by reference to which the embodiment of the invention illustrated in Figures is described and explained in more detail.

BRIEF DESCRIPTION OF THE DRAWING

The drawing includes FIGS. 1-4, as follows.

DETAILED DESCRIPTION OF THE BEST MODE OF THE INVENTION

FIGS. 1 to 4 respectively show a schematic plan view of a soldering module 10 according to the invention for a soldering system for selective wave soldering in different operating positions. The design and functioning of the soldering module 10 will be explained overall below with reference to FIGS. 1 to 4. Corresponding components and elements are thereby provided with corresponding reference numbers.

Figure 1:
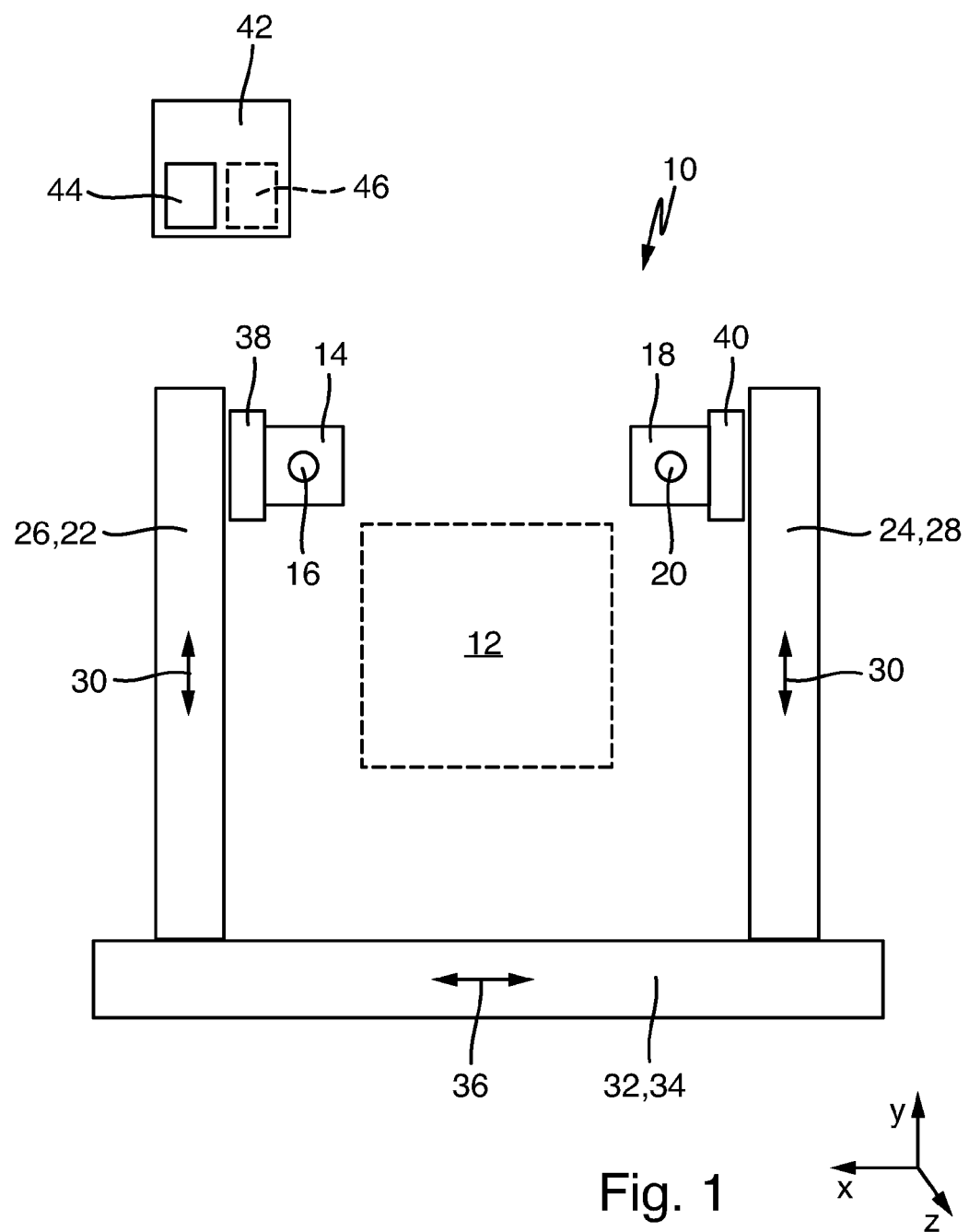
FIG. 1 shows a schematic plan view of a soldering module according to the invention for a soldering system for selective wave soldering in a starting position for processing a printed circuit board.

FIG. 1 shows a plan view of a soldering module 10 according to the invention in a starting position before processing a printed circuit board 12. The soldering module has a first solder pot 14 with a schematically portrayed solder nozzle 16 and a second solder pot 18 with a schematically portrayed solder nozzle 20. The solder pots 14, 18 furthermore have solder pumps (not shown) for producing a standing wave of a liquid solder by means of which components inserted through a printed circuit board 12 from a top side can be bonded from a bottom side of the printed circuit board 12. Furthermore, the solder pots 14, 18 may have spray nozzles (also not shown) for applying a flux. By applying a flux (what is known as fluxing), wetting of the components by the liquid solder can be improved.

It is conceivable for the solder pots 14, 18 to have different solder nozzles 16, 20, or to use a different solder in the solder pots 14, 18.

The soldering module 10 has two moving devices 22, 24 and two y-axis drives designed as linear drives 26, 28 or linear motors. The solder pots 14 to 18 are displaceable on the moving devices 22, 24 by means of the linear drives 26, 28 along a y-axis direction (identified with double arrows 30). The first moving device 22 and the first y-axis drive 26 are thereby associated with the first solder pot 14, wherein the second moving device 24 and the second y-axis drive 28 are associated with the second solder pot 18. The first and second y-axis drive 26, 28 can be operated independently of each other.

The soldering module 10 furthermore has a guide 32 on which the first moving device 22 and the second moving device 24 can be moved by means of an x-axis drive 34 along an x-axis direction (identified by the double arrow 36). Advantageously, the x-axis drive 34 is also designed as a linear motor. The x-axis drive 34 is designed such that the first moving device 22 and the second moving device 24 can be moved independently of each other in the x-axis direction on the guide 32.

The solder pots 14, 18 are indirectly attached to the moving devices 22, 24 by means of z-axis drives 38, 40 that are also designed as linear drives (linear motors, racks, belts or spindles). The first solder pot 14 is attached to the first moving device 22 by means of a first z-axis drive 38, wherein the second solder pot 18 is attached to the second moving device 24 by means of a second z-axis drive 40. By means of the z-axis drives, the solder pots 14, 18 can be moved in a direction orthogonal to a plane spanned by the x-axis direction and y-axis direction, i.e. in a direction orthogonal to the printed circuit board 12. Accordingly, the solder pots 14, 18 can be moved toward the printed circuit board 12 or away from the printed circuit board, by means of the z-axis drives 38, 40. The z-axis drives 38, 40 can be operated independently of each other such that the solder pots 14, 18 can move independently of each other toward the printed circuit board 12 and away from this.

The soldering module 10 has a control device 42 which is designed to actuate the axial drives 26, 28, 34, 38, 40 such that a collision of the solder pots 10 [sic] during operation is avoided. The control device 42 has a first axial or CNC control 44 and an optional, second axial or CNC control 46.

The functioning of the soldering module will now be explained with reference to FIGS. 1 to 4.

When the control device has two CNC controls 44, 46, the solder pots 14, 18 can move completely independently of each other to enable processing of printed circuit board panels in the x-direction and y-direction.

FIG. 1 shows the soldering module 10 in a starting position before processing a printed circuit board 12. The solder pots 14, 18 are located in a park or service position.

Figure 2:
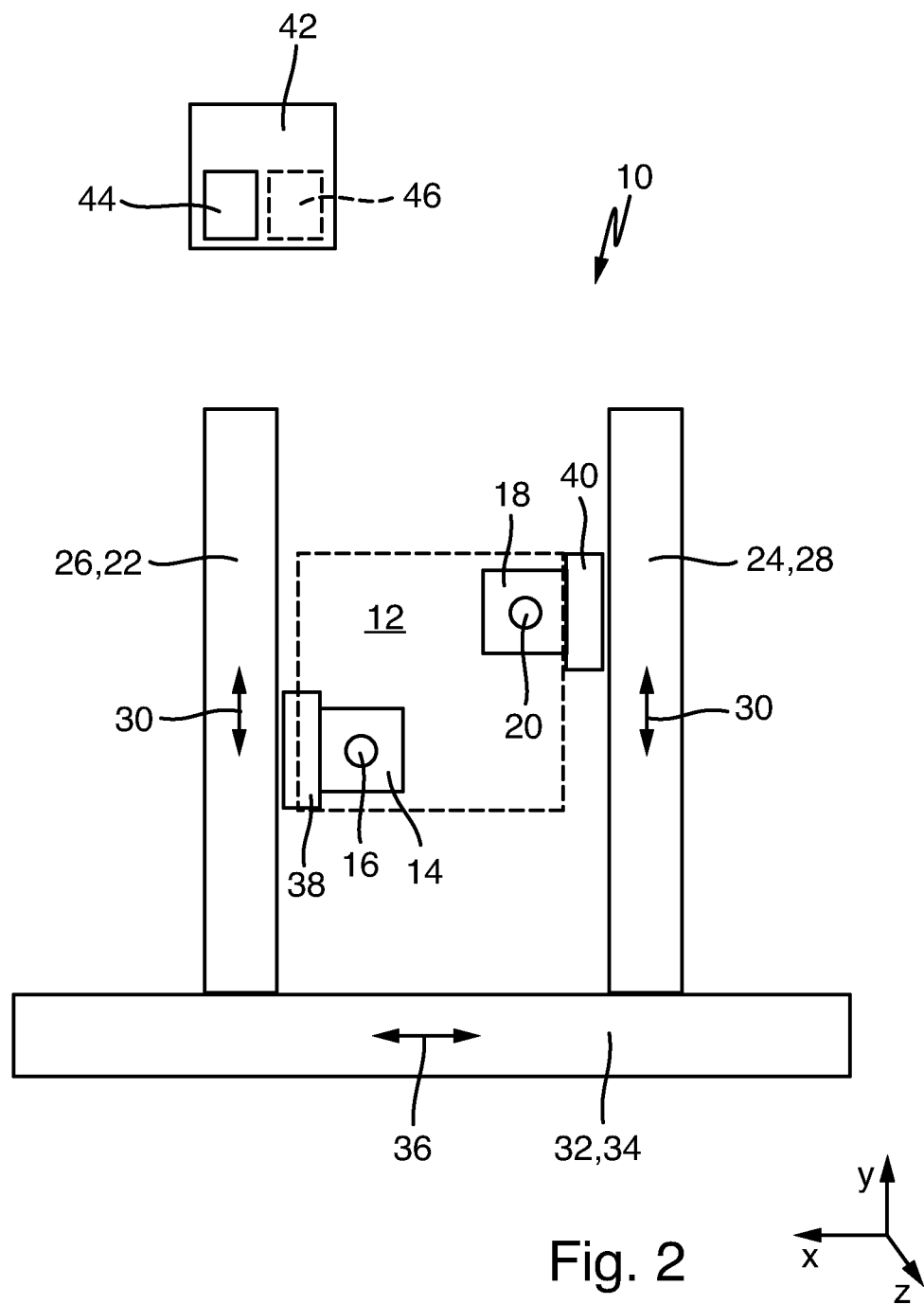
FIG. 2 shows a schematic plan view of the soldering module according to FIG. 1 while processing a printed circuit board.

FIG. 2 shows the soldering module 10 while processing the printed circuit board 12, wherein the solder pots 14, 18 are moved completely independently of each other. The control device 42 ensures that the solder pots 14, 18 cannot collide. The first solder pot 14 is moved in that the first CNC control 44 actuates the axial drives associated with the first solder pot 14, i.e. the x-axial drive 34, the first y-axial drive 26 and the first z-axial drive 38. The second solder pot 18 is moved in that the second CNC control 46 actuates the axial drives associated with the second solder pot 18, i.e. the x-axial drive 34, the second y-axial drive 28 and the second z-axial drive 40.

The solder pots 14, 18 are moved along preprogrammed paths of two different CNC programs. A standing wave of liquid solder, produced in each of the solder pots 14, 18, bonds the components arranged on a printed circuit board 12 from a bottom side of the printed circuit board 12.

Figure 3:
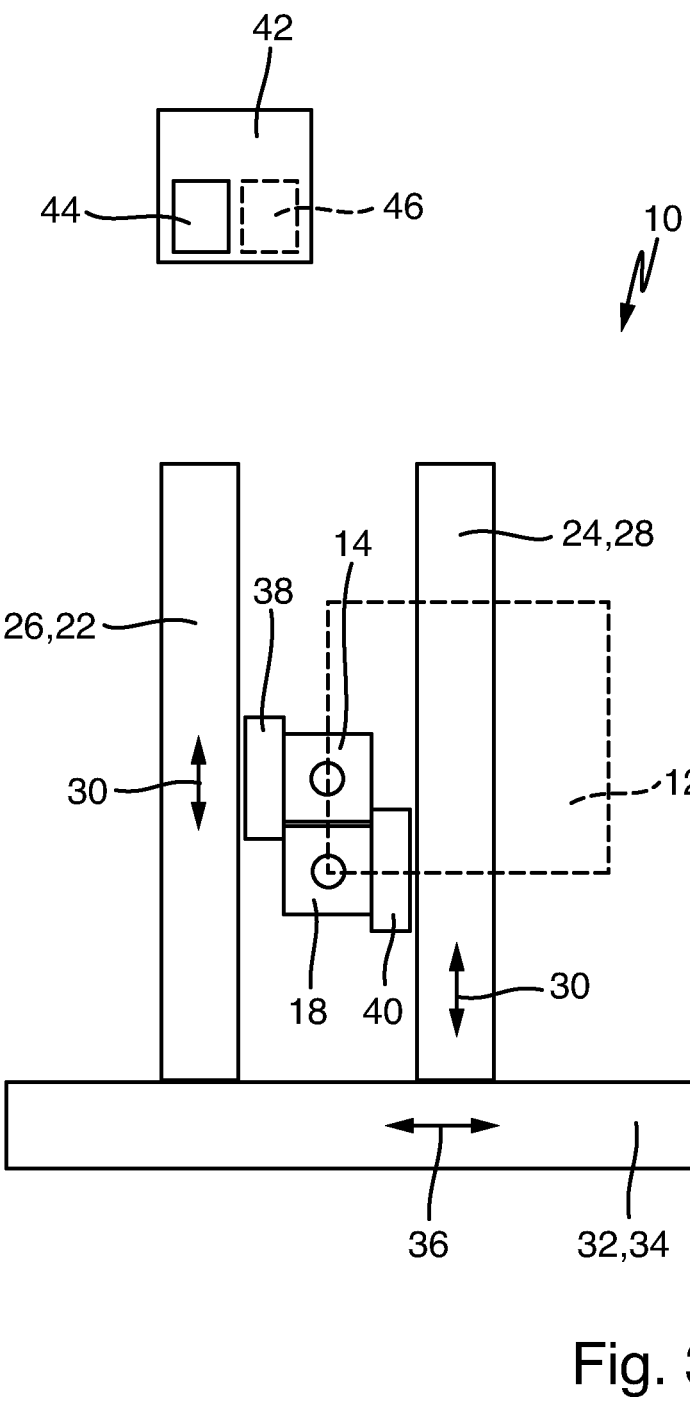
FIG. 3 shows a schematic plan view of the soldering module according to FIGS. 1 and 2 with a solder pot spacing that is minimized in the y-direction.

The soldering module 10 according to the invention enables highly variable bonding. FIG. 3 shows, for example, a processing situation in which the solder pots 14, 18 are displaced into a soldering pot spacing that is minimized in the y-direction.

Figure 4:
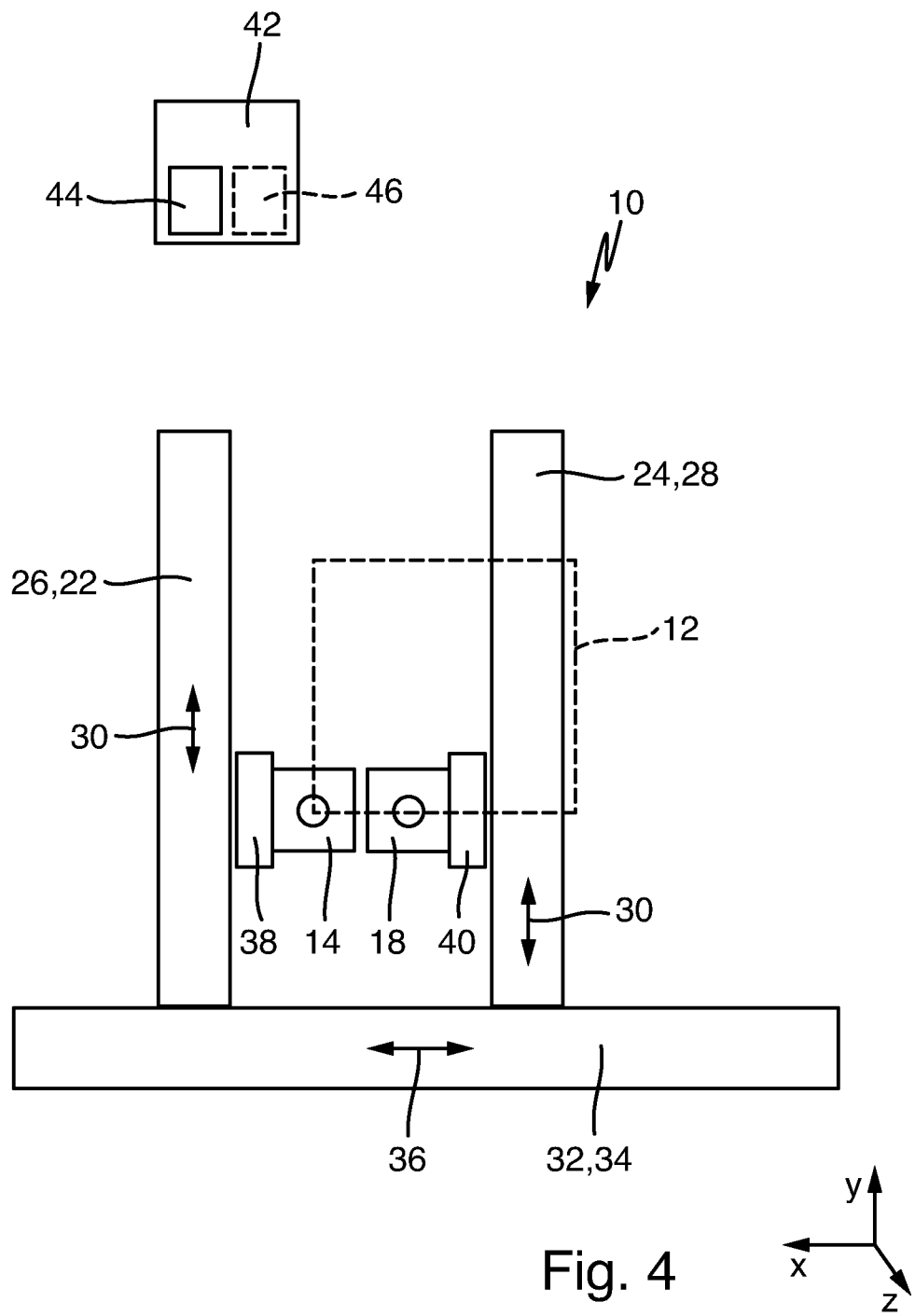
FIG. 4 shows a schematic plan view of the soldering module according to FIGS. 1 through 3 with a solder pot spacing that is minimized in the x-direction.

FIG. 4 shows a processing situation in which the solder pots 14, 18 are displaced into a soldering pot spacing that is minimized in the x-direction.

In the situation shown in FIGS. 1 to 4, the solder pots 14, 18 are moved within a common work area. However, it is also conceivable to provide CNC programs in the CNC controls 44, 46 that provide respective separate work areas for the solder pots 14, 18 to avoid a collision due to the selected path of movement.

It is, however, also conceivable for the control device 42 to only have one CNC control 44. The CNC control 44 is then designed so that either only the first solder pot 14 or the second solder pot 18 is moved, and the respective other solder pot 18, 14 remains in the park or service position shown in FIG. 1.

It is also conceivable for the CNC control 44 to be designed so that the axial drives 26, 28, 34, 38, 40 are actuated such that the two solder pots are displaced in sync.

Overall, a highly variable processing in selective wave soldering of printed circuit boards is enabled with the soldering module 10 according to the invention. device is associated with the second solder pot.

SCOPE OF THE INVENTION

It should be understood that, unless stated otherwise herein, any of the features, characteristics, alternatives or modifications described regarding a particular embodiment herein may also be applied, used, or incorporated with any other embodiment described herein. Also, the drawing herein is not drawn to scale. Although the invention has been described and illustrated with respect to exemplary embodiments thereof, the foregoing and various other additions and omissions may be made therein and thereto without departing from the spirit and scope of the present invention.

The invention claimed is:

1. A soldering module (10) for a soldering system for selective wave soldering, having at least one first solder pot (14) and at least one second solder pot (18), wherein the at least one first solder pot (14) and the at least one second solder pot (18) are displaceable along an x-axis by means of an x-axis drive (34), along a y-axis by means of a y-axis drive (26, 28), and along a z-axis by means of a z-axis drive (38, 40), wherein the x-axis, the y-axis and z-axis are all arranged orthogonally in relation to each other, characterized in that two y-axis drives (26, 28) and two moving devices (22, 24) are provided on which the at least one first solder pot (14) and the at least one second solder pot (18) are displaceable along the y-axis by means of the two y-axis drives (26, 28), wherein a first moving device (22) is associated with the at least one first solder pot (14), and wherein a second moving device (24) which is different from the first moving device (22) is associated with the at least one second solder pot (18), wherein a first y-axis drive (26) can be operated independently of a second y-axis drive (28) in such a way that a single printed circuit board or a single board panel can be processed by the at least one first solder pot (14) and the at least one second solder pot(18).

2. A soldering module (10) according to claim 1, characterized in that the soldering module (10) comprises a guide (32) on which the first moving device (22) and the second moving device (24) can be moved along the x-axis.

3. The soldering module (10) according to claim 1, characterized in that the soldering module (10) comprises at least one guide (32) on which the first moving device (22) and the second moving device (24) can be moved along the x-axis, wherein the first moving device (22) is associated with the at least one guide and can be moved along the x-axis on the first guide, and wherein the second moving device (24) is associated with the at least one guide and can be moved along the x-axis on the second guide.

4. The soldering module (10) according to claim 3, characterized in that the soldering module (10) comprises two x-axis drives (34) for moving the two moving devices (22, 24) on the first guide and the second guide that can be operated independently of each other.

5. The soldering module (10) according to claim 1, characterized in that the x-axis drive (34), the two y-axis drives (26, 28) and the Z-axis drive (38, 40) are designed as linear drives, and/or as rack and pinion drives, and/or as spindle drives, and/or as toothed belt drives.

6. The soldering module (10) according to claim 1, characterized in that the soldering module (10) comprises a control device (42).

7. The soldering module (10) according to claim 6, characterized in that the control device (42) is designed to actuate the x-axis drive (34), the two y-axis drives (26, 28) and the Z-axis drive (38, 40) such that a collision of the at least one first solder pot (14) and the at least one second solder pot (18) during operation is avoided.

8. The soldering module (10) according to claim 6, characterize that the control device (42) comprises a CNC control (44) which is designed such that the at least one first solder pot (14) and the at least one second solder pot (18) are displaced in sync.

9. The soldering module (10) according to claim 6, characterized in that the control device (42) comprises a first CNC control (44) that controls the X-axis drive (34), a first Y-axis drive (26), and a first Z-axis drive (38) that are associated with the at least one first solder pot (14), and the control device (42) comprises a second CNC control (46) that controls the X-axis drive (34), a second Y-axis drive (28) and a second Z-axis drive (40) that are associated with the at least one second solder pot (18).

10. The soldering module (10) according to claim 1, characterized in that the at least one first solder pot (14) has a first tool, including a first solder nozzle (16), and the at least one second solder pot (18) has a second tool, including a second solder nozzle (20), wherein the first tool is different from the second tool.

11. A method for operating a soldering module (10) for a soldering system for selective wave soldering according to claim 1, characterized in that the at least one first solder pot (14) and the at least one second solder pot (18) move independently of each other in the x-axis, y-axis, and z-axis, in such a way that the single printed circuit board or the single board panel is processed by the at least one first solder pot (14) and at least one second solder pot(18).

12. The soldering module (10) according to claim 7, characterize that the control device (42) comprises a CNC control (44) which is designed such that the first at least one solder pot (14) and the at least one second solder pot (18) are displaced in sync.

13. The soldering module (10) according to claim 7, characterize that the control device (42) comprises a CNC control (44) which is designed such that only the at least one first solder pot (14) is moved, and the at least one second solder pot (18) remains in a park position.

* * * * *